United States Patent [19]

Marancik

[11] 4,101,731
[45] Jul. 18, 1978

[54] COMPOSITE MULTIFILAMENT SUPERCONDUCTORS

[75] Inventor: William G. Marancik, Basking Ridge, N.J.

[73] Assignee: Airco, Inc., Montvale, N.J.

[21] Appl. No.: 716,312

[22] Filed: Aug. 20, 1976

[51] Int. Cl.² .......................................... H01L 39/02
[52] U.S. Cl. ............................ 174/126 S; 174/128 S;
427/63; 204/192 S; 335/216; 29/599
[58] Field of Search ................. 427/63, 62, 124, 102,
427/93, 91; 29/599; 307/245, 277, 306;
204/192; 156/169; 355/216; 174/126 S, 128 S

[56] References Cited

U.S. PATENT DOCUMENTS

| 3,686,750 | 8/1972 | Woolcock et al. | 29/599 |
| 3,763,552 | 10/1973 | Brown et al. | 29/599 |
| 3,824,082 | 7/1974 | Vieland et al. | 427/62 X |
| 3,837,907 | 9/1974 | Berglund et al. | 427/93 |
| 3,918,998 | 11/1975 | Marancik et al. | 148/11.5 R |
| 3,983,521 | 9/1976 | Faruto et al. | 174/126 S X |

FOREIGN PATENT DOCUMENTS 410,505   5/1974   U.S.S.R.

OTHER PUBLICATIONS

Testardi et al., "Superconductivity with Onset above 23° K in Nb-Ge Sputtered Films", Solid State Communications, 15(1):1–4, Jul. 1, 1974.
Gavaler, "Superconductivity in Nb-Ge Films above 22° K", Applied Physics Letters, 23(8):480, (1973).

Primary Examiner—Ralph S. Kendall
Attorney, Agent, or Firm—E. W. Bopp; M. de Angeli; L. R. Cassett

[57] ABSTRACT

A composite multifilament superconducting structure is provided, which includes an elongated substrate-carrying, longitudinally-directed, sputtered discrete filament of an A-15 type intermetallic superconductor. In a preferable procedure, a plurality of spaced, generally longitudinal grooves are formed on the surface of an elongated filamentary substrate, preferably a metal wire. The walls of the grooves on the substrate surface are shaped to undercut the curvilinear surface of the substrate located between two adjacent grooves so that at least some of the wall portions of the grooves are geometrically shadowed during the subsequent sputtering step in which a superconductor is sputtered onto the substrate. In particular, a film of a suitable superconducting intermetallic compound having A-15 crystalline structure, such as $Nb_3Ge$, is thereupon sputtered onto the grooved substrate and deposits at the bottom of the grooves and at the surface portions of the substrate between grooves. The shadowed wall portions remain substantially deposit-free so that the resultant spaced deposits extend as distinct lines or bands along the substrate to thereby constitute the superconductive filaments. A plurality of such substrates may, if desired, be consolidated into a further composite structure, by bundling the substrates and passing same through a molten metal. The resultant structure may then be sized to yield as a final product a composite of the substrates bearing the superconducting filaments in a surrounding matrix of the metal.

16 Claims, 6 Drawing Figures

COMPOSITE MULTIFILAMENT SUPERCONDUCTORS

BACKGROUND OF INVENTION

This invention relates generally to the field of superconductivity, and more specifically relates to a novel multifilament superconductor and its method of manufacture.

Composite superconducting wire characterized by multiple longitudinally extending strands of high field superconducting compound in a surrounding matrix of a good thermal conductor such as aluminum or copper has found application in a number of important fields, e.g. in superconducting magnets capable of producing extremely high magnetic fields. Similarly, such composite wire has been of great interest in connection with many electrical applications, notably including for use in power generation and transmission.

In the foregoing connection, it may be observed that while the phenomenon of superconductivity has been known for over half a century, the applications of this striking discovery have in totality been quite limited. A principal if not the major reason underlying such limited application has been that until very recently known superconductors have exhibited very low transition temperatures. Indeed, until such recent times, virtually all practical superconducting materials exhibited critical temperatures (Tc) requiring the use of liquid helium as a refrigerant.

Within recent years, however, a number of Type II superconductors have been reported, with relatively high transition temperatures. Thus, for example, in approximately 1953 the compound $V_3Si$ was reported and found to become superconducting at 17.1° K. Not long thereafter, the compound $Nb_3Sn$ was developed. Like $V_3Si$, the latter is a type A-15 compound, and exhibits a Tc of 18° K. More recently, a ternary A-15 compound, $Nb_3Al$ Ge with a Tc of 20.05° K has been found — with the critical temperature thereof reportedly being raisable somewhat further by specific fabrication methods. A further compound, $Nb_3Ga$, another A-15 type, was reported in 1971, and found to be superconducting at approximately 20.3° K. Yet more recently, there was announced the discovery that the compound $Nb_3Ge$ (also an A-15 Type) could maintain it superconductive properties at temperatures of 23.2° K at which temperature liquid hydrogen can be used as the refrigerant.

The A-15 structure, as is well-known to investigators in the present art, represents a large fraction of known superconducting compounds. The A-15 unit cell is thus based on the stoichiometric $A_3B$ ratio, in which all ($\frac{1}{2}$, $\frac{1}{4}$, 0) sites are occupied only by A atoms, and all (0, 0, 0) and ($\frac{1}{2}$, $\frac{1}{2}$, $\frac{1}{2}$) sites are occupied solely by B atoms. It of course will be understood that this idealized stoichiometric structure is in general not completely achieved in any real fabrication technique.

The $Nb_3Ge$ compound cited, because of its unusually high Tc characteristic, has been the subject of considerable investigation. Reference may be had in this connection to the technical papers "Superconducting With Onset Above 23° K in Ng-Ge Sputtered Films" by L. R. Testardi et al, *Solid State Communications* 15(1): 1–4 (July 1, 1974); and "Superconductivity in Nb-Ge Films Above 22° K" by J. E. Gavaler, *Applied Phys. Letters* 23(8):480(1973). The two cited papers are among several that report the use of D.C. sputtering techniques in a high purity environment for the purposes of producing what appears to be a nearly perfect stoichiometric $Nb_3Ge$ compound. Investigators in the art have tentatively concluded that it is the fact that the films sputtered by the reported technique are in a more crystallographically ordered state than has been possible with prior techniques for bulk formation of $Nb_3Ge$ films, and reference should be had to the cited papers for details of the sputtering process. These papers are thus incorporated by reference into the present specification.

While the $Nb_3Ge$ sputtered films are therefore of enormous interest to practitioners in the present art, it has been found in practice that such films are extremely brittle — which indeed is also the case with other superconducting materials possessing the A-15 structure. While this property can be tolerated in other A-15 compounds such as $Nb_3Sn$ because the Nb and Sn can be reacted in situ after the multifilament structure has been worked to its final form, this is impossible with $Nb_3Ge$ which must be sputtered to achieve the ordered structure necessary for the desired high Tc.

Other approaches have been used to produce a plurality of superconductive filaments of the A-15 structure on a substrate. One such approach is shown in U.S.S.R. Patent No. 410,505 which was published May 12, 1974 and is incorporated herein by reference. The method described in that patent produces a flat superconductor cable with a plurality of parallel spaced superconductor ribbons which are vacuum vaporized and condensed on a grooved flat substrate. During film depositing, the substrate is disposed at an angle to the vapor source so that a portion of each groove remains deposit-free due to geometric shadowing thereby providing a plurality of spaced superconductor ribbons on the substrate.

This approach is not suitable for making superconductor wire especially where the superconductor filaments spiral around the conductor because the grooves cannot be maintained at a constant angular disposition to the source of superconductor material. The approach described above, when applied to wires, causes bridges of superconductor material to be formed between adjacent superconductor portions on the exterior of the conductor. A further disadvantage of this approach is that vacuum deposition is not suitable for depositing all types of films because the desired chemical composition of the film cannot always be maintained.

SUMMARY OF INVENTION

Now in accordance with the present invention, a composite multifilament superconducting structure is provided, which includes an elongated substrate-carrying, longitudinally-directed, sputtered discrete filament of A-15 type intermetallic superconductor. Although it is possible to deposit the sputtered superconductor as a uniform film and thereafter remove portions thereof so that the remainder defines the said filaments, in a preferable procedure the superconductor (which may, e.g., comprise a film of $Nb_3Ge$) is sputtered onto a grooved substrate wherein the groove geometry provides a shadowing effect such that the film directly deposits as the aforementioned discrete filaments.

In a preferable procedure, a composite multifilament superconducting structure including multiple strands of high Tc $Nb_3Ge$ alloy, may be thus manufactured by a process wherein a plurality of spaced grooves are formed into a fine metallic wire or other suitable substrate, which grooves extend longitudinally along the wire. The walls of the grooves thus formed include a portion which undercuts the substrate surface disposed between adjacent grooves whereby at least some wall portions are geometrically shadowed from particulate streams incident normally against the wire surface during the sputtering step which follows. Thus in particular, a film of $Nb_3Ge$ is thereupon sputtered onto the said wire, the film depositing at the bottom portions of the aforementioned grooves, and at the portions of the wire surface between individual grooves. The shadowed portions of the grooves, however, remain substantially deposit-free. In consequence, the spaced deposits effectively define a series of filaments or strands extending lengthwise along the wires, each said strand being spaced from its neighbor. The grooves may be formed into the wire by passing same through a suitable die, or by photoetching or the like; and the wire is preferably twisted after grooving so that the grooves actually spiral along the length of the said wire. A large number of wires thus subjected to the sputtering process outlined may then be drawn as a group through molten aluminum, copper, or other good thermal conductor, and, if desired, the resultant consolidated structure can then be drawn through a sizing die immediately after exiting the melt. The resultant material is a multifilamentary $Nb_3Ge$ composite which can readily contain up to 75 volume percent of the wires bearing the $Nb_3Ge$ filaments.

BRIEF DESCRIPTION OF DRAWINGS

The invention is diagrammatically illustrated by way of example in the drawings appended hereto in which.

DESCRIPTION OF PREFERRED EMBODIMENT

Figure 1:
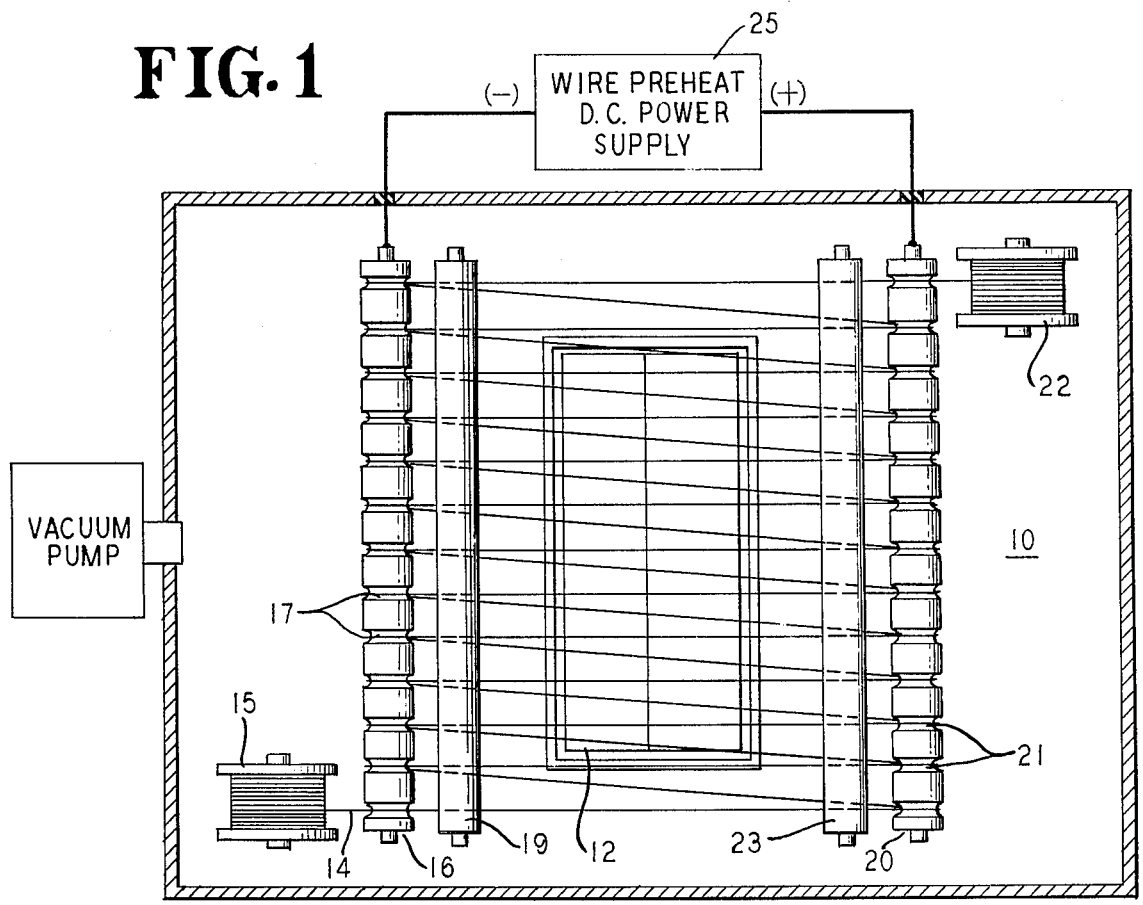
FIG. 1 is a diagrammatic plan view of an apparatus arrangement enabling preparation of superconducting wire in accordance with the present invention.
Figure 2:
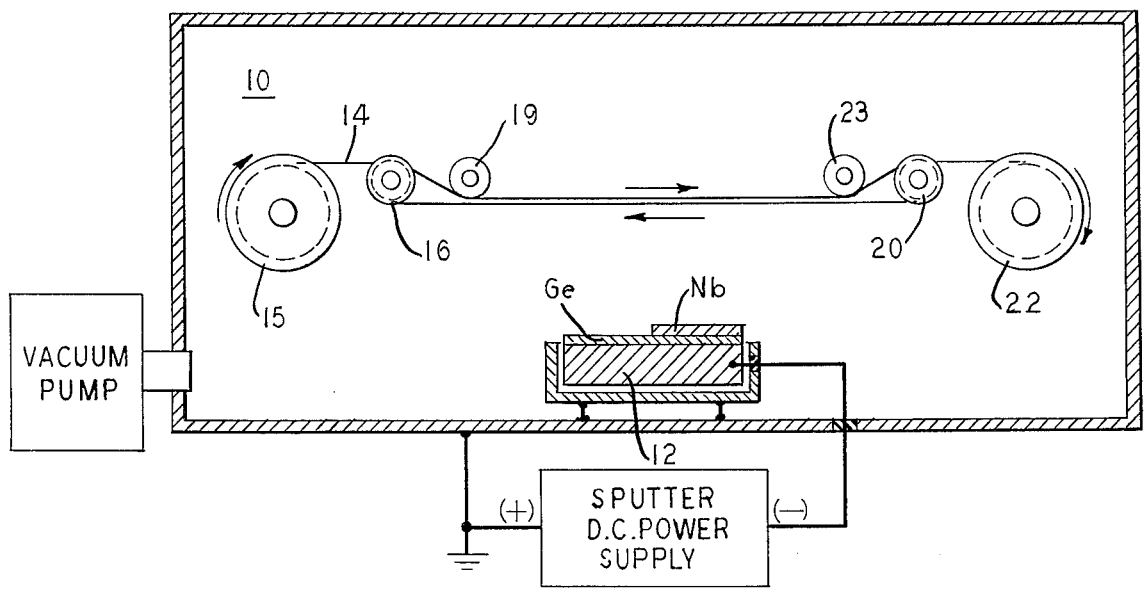
FIG. 2 is a diagrammatic, side view of the apparatus of FIG. 1.

In FIGS. 1 and 2 herein simplified schematic views are set forth illustrating the manner in which the basic sputtering steps of the present invention may be carried out. The basic operation sought to be effected by the apparatus thus indicated is one of depositing by high-purity sputtering techniques a superconductive film of a superconductive intermetallic compound having a suitable A-15 crystalline structure such as $Nb_3Ge$ onto a specific type of grooved wire substrate.

The operations depicted in FIGS. 1 and 2, in a broad sense, are conventional in that the overall sputtering conditions are intended to be in accord with those process conditions reported in the prior art as enabling formation of a highly stoichiometric $Nb_3Ge$ compound. Thus the conditions of sputtering which are utilized in the apparatus depictions of FIGS. 1 and 2 are substantially those which have been described in the Testardi et al, and the Gavaler papers previously cited.

Thus in particular, the basic processes set forth are intended to provide D.C. sputtering in a high-purity environment. Typically in tthe arrangements of these Figures, the background impurity-level is lowered prior to sputtering, to the order of $5 \times 10^{-10}$ torr or less. This may be effected by the technique reported, e.g., in Gavaler et al in a paper entitled "Preparation and Superconducting Properties of Thin Films of Transition Metal Institial Compounds," 6 *Journ. of Vacuum Science & Technology* 177 (1968), where a combination of ultra-high vacuum techniques and gettering are used to reduce the background residual gas contamination. The sputtering target 12 present within the vacuum chamber 10 can also be of the form utilized in the prior art, i.e., the target 12 can be prepared as a composite by partially covering a slice of germanium with a niobium sheet so that half of the exposed surface is niobium, and the other half germanium. During the actual sputtering operation, an argon sputtering atmosphere with pressures of at least 1 milliTorr and typically of the order of 50 – 300 milliTorrs can be utilized, with sputtering voltages in the approximate range of 300 to 3000 volts. Further details of this type of system are set forth in the cited Testardi et al paper.

In the present instance, the wire 14 to be coated with the superconductive $Nb_3Ge$ film passes from a payoff reel 15, and then is coiled about a first capstan 16, which is provided with a series of circumferentially formed grooves 17 — which receive and guide the wire 14. The wire 14 then passes to a spaced second capstan 20, which is provided with grooves 21 similar to grooves 17 and serving the same function. Wire 14 is successively coiled and snaked back and forth between capstans 16 and 20, and in underlying relationship to the guide rollers 19 and 23, before being coiled about a take-up reel 22. The successive passes of wire 14 back and forth between the capstans, assures that all sides of the wire will be exposed to the incident particulate stream from the sputtering target 12.

A power source 25 is connected between capstans 16 and 20, so that a potential is present therebetween. This assures that current is passed through each of the wire portions that proceed across the gap between the capstans. The objective of this operation is to enable heating of the wires so that effectively the deposit of the $Nb_3Ge$ occurs onto a hot substrate — in accordance with the preferred conditions described in the aforementioned Gavaler and Testardi papers. Typically, for example, the temperature of the substrate defined by the wires is maintained at the order of 650° – 750° C.

It of course will be evident to those familiar with the sputtering art that the particulate stream which ultimately defines the deposits which will occur upon wire 14 pass in essentially straight lines from the sputtering target 12 onto wire 14 — as the latter passes through the gap between capstans. Those skilled in the sputtering art will also realize that baffles may be placed in the sputtering chamber some of which may be parallel to the path of movement of wire 14 to prevent particles from sputtering target 12 portions not immediately adjacent to wire 14 from striking the surface of the wire 14. In this manner, the portions of each groove which undercut an adjacent curvilinear surface are not coated with a superconducting material.

Wire 14 per se comprises a relatively thin gauge copper or other good thermal and electrical conductor such as molybdenum or high-strength steel. The wire is of generally cylindrical cross-section and typically has a diameter of the order of 10 mil; or more generally in the range of from 0.100 inch to 0.004 inch. In accordance with a principal aspect of the present invention, wire 14, prior to passage through sputtering chamber 10, is provided with a series of grooves 26, which may best be seen from consideration of the partially cross-sectioned views of FIGS. 3, 4, and 6. In a typical instance, grooves 26 may be formed into wire 14 by passing same through a suitable forming die. Other techniques, such as machining, stamping, and most notably photoetching, may be utilized to produce the preferred type of groove appearing in FIG. 4. The reasons for this latter construction will shortly be evident.

Figure 3:
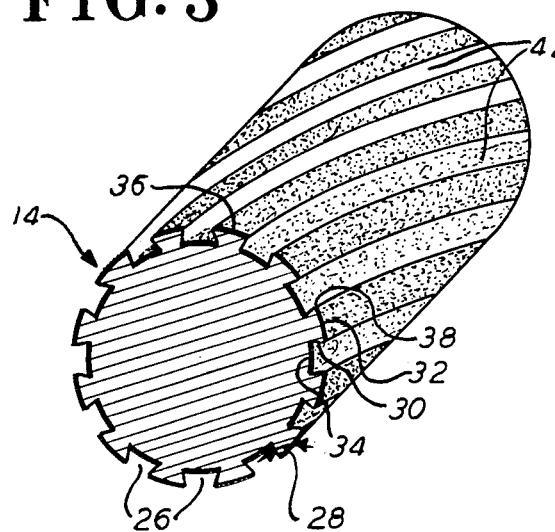
FIG. 3 is a perspective, partially cross-sectional view of a portion of wire processed as in FIGS. 1 and 2, and illustrates the manner in which the superconducting material is deposited during the sputtering process.
Figure 4:
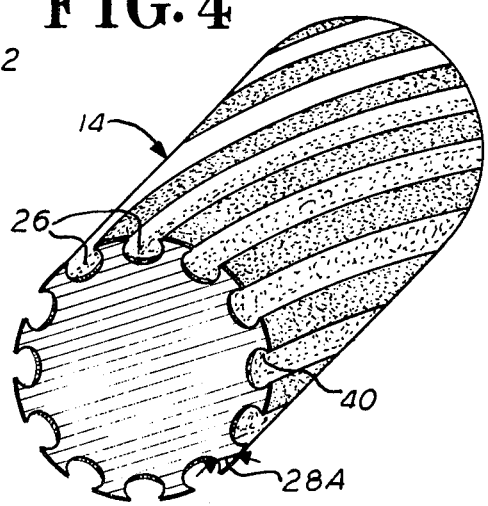
FIG. 4 is a further perspective, partially sectioned view, illustrating the manner in which superconducting material is deposited upon a wire bearing preferred types of grooves.
Figure 6:
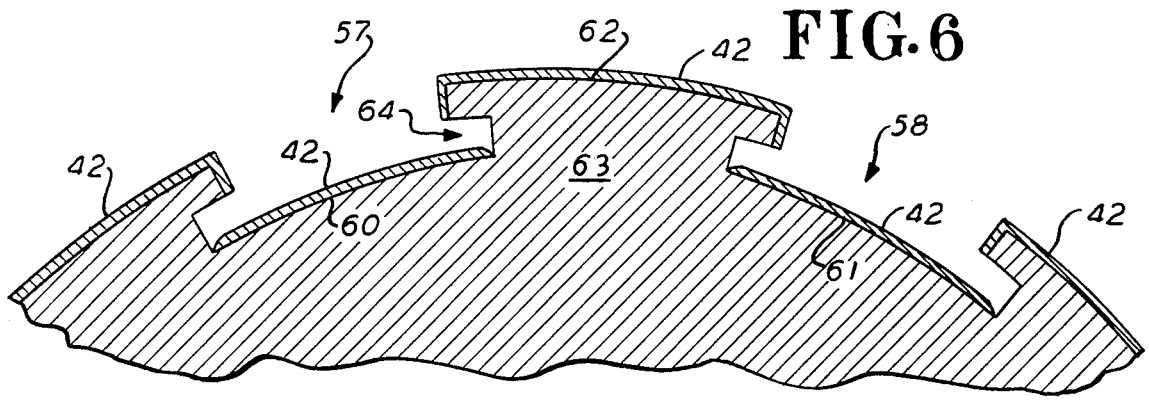
FIG. 6 is a partial cross-sectional view of a conductor according to the invention with an inverted T-shaped groove.

Basically, it will be clear from consideration of FIGS. 3, 4, and 6 that the superconducting film of $Nb_3Ge$ is sputter-deposited during the passage of wire 14 through chamber 10, at such portions of the wire as are accessible to the particulate stream. In accordance with the present invention, the grooves 26 in FIGS. 3 and 4 are so formed that the angle 28 defined between the lateral walls 30 of the grooves and the adjacent surface 32 of the wire is no more than 90°; and preferably (as shown in FIG. 4) is substantially less than 90°. The objective of such an arrangement is to assure that the particulate stream which will ultimately define the deposited film, while depositing at the bottom portion 34 of grooves 26, and also at the curvilinear surface portions 36 of the wires between grooves, does not substantially deposit upon the wall portions 38 of the grooves, which portions abound the wire surface. This result, of course, occurs as a consequence of "shadowing", which is to say that the sputtered particulate stream — as it moves in substantially straight lines — behaves much in the manner of light rays (i.e., when viewed from a simple geometric viewpoint); and hence at least the portions 38 indicated, will tend to be relatively free of film deposits as they undercut the curvilinear surface portions 36.

It will (in consideration of the foregoing) be evident that a preferable grooving arrangement enabling the desired shadowing effect may be achieved by the construction of FIG. 4, wherein the angle 28A is markedly less than 90°. This type of grooving can be achieved with dies; but may also be effected by photoetching techniques wherein the areas 40 tend to result during the "undercutting", which results during etching. In this sort of arrangement (FIG. 4), it will be clear that the shadowing effect is quite pronounced; and hence the areas 40 are almost entirely free of any deposits of the superconducting film.

An alternative groove structure is shown in FIG. 6. In this alternative arrangement, the grooves 57 and 58, in the shape of inverted Ts, are of sufficient widths that the respective bottoms 60 and 61 are approximately equal to the width of the curvilinear area 62 disposed between grooves 57 and 58. In this manner, the superconductor which is subsequently deposited on the substrate 63 lies on adjacent surfaces, for example 60 and 62, disposed at different radial distances from the center of the conductor.

Adjacent conductive film deposits on, for example, surfaces 60 and 62, each provide a good superconductor which is isolated from the others due to the fact that an undercut 64 in the side wall is provided. The shape of the undercut portion 64 is not critical although it must undercut the curvilinear surface 62 sufficiently so that it will not be coated when the conductor passes through the sputtering chamber. Indeed, that is the criteria for all the sputtered superconductors according to the invention, i.e., that the undercut is sufficiently large to prevent forming a bridge of superconductor material between, for example, surface 60 and 62.

In considering the views of FIGS. 3 and 4 it will be evident that the result of the foregoing process in one of introducing into the grooved wire 14 a series of superconducting deposits in the nature of line or narrow belt-like filaments 42 which run lengthwise along the said wire, each said filament being separated from its neighbor by the material of the central wire. In effect, therefore, a composite structure has been provided comprising a central cylindrical wire 14, in which are now embedded or attached a series of superconductive $Nb_3Ge$ filaments 42 which proceed in generally lengthwise fashion along the said wire.

As a further variation, a wire having a circular cross section can be longitudinally grooved with grooves that have side walls that intersect the conductor at about 90°. Thereafter, the grooved wire can be drawn through a die to reduce the wire size. The drawing process, however, will produce a lip over the edge of the grooves which means that a portion of the groove will undercut the wire surface. As such, a grooved wire without an undercutting portion can be worked to produce the desired undercut.

It may be further noted that as is known in the present art it is desirable because of skin conductivity effects (during A.C. or sharply pulsed current use) to transpose or twist the superconductor filaments 42 with respect to one another so that current is forced to travel throughout the volume of the conductor. In the present instance this result may be effected in extremely simple fashion. In particular all that is required is to render the grooves 26 initially formed in wire 14 as helices (i.e. with respect to the axis of wire) — which may be effected by a simple twisting of the wire prior to its treatment in chamber 10. Thus in the showings of FIGS. 3 and 4, the superconducting filaments 42, and the grooves 26 in which they are deposited, are in fact shown advancing along the wire in helical fashion, although it will be understood that it is also within the province of the invention for the grooves 26 to advance along wire 14 in simple parallel fashion.

Figure 5:
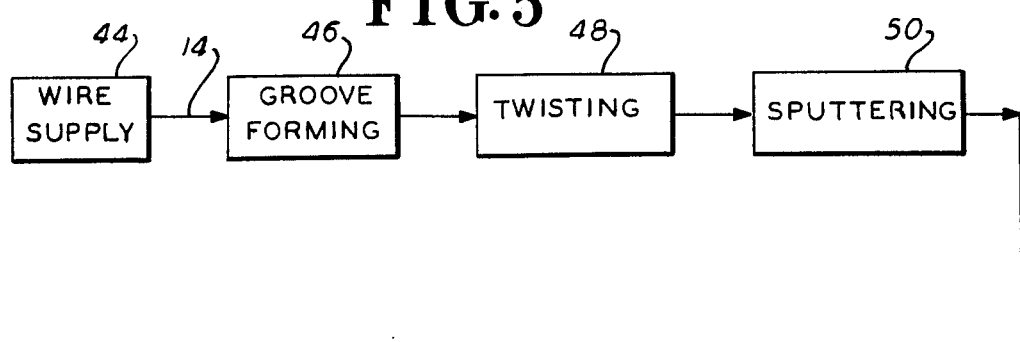
FIG. 5 is a block, flow diagram, illustrating an overall process for manufacture of composite superconducting wire and consolidated structure by the method of the invention.

In FIG. 5 a simplified schematic flow diagram is set forth, illustrating the manner in which a composite superconducting structure, consisting of a plurality of wires as in FIGS. 3, 4, and 6, may be formed by the method of the invention. Thus in particular, wire 14 preceding from the supply source 44, such as a reel, is initially provided with the grooves 26 of FIGS. 3 and 4, and 57, 58 of FIG. 6, at groove forming station 46. As already mentioned, this may be effected by passage of the wire through a suitable die, or other mechanical-forming device; or photoetching or similar techniques may be utilized. The wire then preceding from the grooving operation is twisted at station 48 so as to introduce the preferable helical form of the running grooves. The wire thence proceeds directly to the sputtering apparatus 50 which has been previously described in connection with FIGS. 1 and 2. The wire may then be cut to desired lengths, and a series of wires are then collected in parallel as a bundle (at station 52). Typically, for example, where 10 mil wire is utilized, a grouping of such parallel wires may be utilized. The wires arranged in the bundled group, e.g. as a cylinder, are then passed through a melt 54 of a nonsuperconductive metal possessing good electrical and thermal conductivity as, for example, molten aluminum or copper. The grouped wires preceding from the melt operation may, if desired, while still hot, be passed through a sizing die 56 which sizes the resultant composite structure to a substantially final diameter. The resultant material is a multifilamentary $NB_3Ge$ or similar A-15 composite, in a normally conductive metallic matrix (e.g. aluminum); and in a typical instance such a composite may contain up to 75 volume percent of superconducting filament bearing substrates.

The grooved substrates upon which the superconductive filaments are deposited by sputtering need not be circular in cross-section, but may be of other preferred geometry. They also need not be metal wire, although such composition is preferred.

It will, of course, also be evident that the shape of the resulting composite structure, i.e., the structure resulting from the process of FIG. 5, can be of a desired shape, such as round, rectangular, and/or tube-shaped, etc. Similarly, it will be clear that the process set forth in FIG. 5 can be conducted on substantially a continuous basis, if so desired. The condition of consolidation effected at stations 52, 54, and 56 can be varied for a desired situation. For example, other metals in addition to aluminum and copper can constitute the melt, and the individual wires prior to consolidation may, if desired, be coated with aluminum, copper or so forth, as an initial step.

While the present invention has been particularly set forth in terms of specific embodiments thereof, it will be understood in view of the present disclosure, that numerous variations upon the invention are now enabled to those skilled in the art, which variations yet reside within the scope of the present teaching. Accordingly, the invention is to be broadly construed and limited only by the scope and spirit of the claims now appended hereto.

It is claimed:

1. A method of manufacturing a multi-filament superconductor comprising the steps of:
   a. forming a plurality of spaced, helical grooves along the length of a substantially cylindrical conductor made of normally conductive material, at least a portion of the wall of each groove undercutting the surface of the conductor adjacent to the groove; and
   b. passing the grooved conductor through a sputtering chamber to sputter a thin film of a superconductive intermetallic compound onto the surface of the conductor and onto at least one surface of the groove that does not intersect the conductor surface while leaving the undercut surfaces of the groove substantially deposit-free due to shadowing.

2. The method of claim 1 wherein each groove has a width substantially equal to the width of the conductive surface between two adjacent grooves.

3. The method of claim 1 wherein the superconductive intermetallic compound is of the A-15 type.

4. The method of claim 3 wherein the superconductive intermetallic compound is $Nb_3Ge$.

5. The method of claim 4 wherein said film is deposited on said wire in a vacuum chamber with an inert gas atmosphere of at least 1 milliTorr partial pressure, the residual gas pressure being less than $10^{-5}$ Torr, the temperature of said wire being maintained during film depositing in the range of from approximately 650° – 750° C.

6. The method of claim 1 wherein the portion of each said groove that undercuts the conductor surface is disposed in substantially parallel relation to the conductor surface.

7. The method of claim 1 additionally including the step of:
   assembling a plurality of film-sputtered conductors into a bundle; and
   passing the bundle through a melt of a normally conductive molten metal and allowing said metal to cool and solidify so as to consolidate the bundle into a composite conductor comprising a number of film-sputtered conductors in a nonsuperconductive matrix of the metal.

8. The method of claim 1 wherein each groove is initially formed longitudinally in the conductor and the conductor is subsequently twisted to dispose each groove in a helix.

9. The method of claim 1 wherein said grooved conductor is formed by passing a conductor through a forming die.

10. The method of claim 1 wherein said grooves are formed by photoetching said wire.

11. The method of claim 1 wherein said sputter-deposited film is substantially stoichiometric $Nb_3Ge$.

12. A composite multifilament superconductor comprising:
   a unitary central metallic wire of normally conductive metal, said wire having a plurality of spaced grooves extending longitudinally along said wire, each said groove having at least a portion undercutting the surface of said wire;
   a thin film of substantially stoichiometric superconductor material being sputter-deposited along at least a portion of each groove and deposited on the portions of said wire between said grooves, at least part of each said undercut portion being deposit-free so that film deposits on each of said portions of said wire between said grooves and on adjacent grooves are separated from one another by a deposit-free undercut portion.

13. The superconductor of claim 12 wherein said superconductive material is $Nb_3Ge$.

14. The superconductor of claim 12 wherein each said groove is spiralled along the length of said wire thereby defining a helix.

15. A composite superconductor comprising:
   a plurality of unitary central metallic wires made of a normally conductive metal, each said wire having a plurality of spaced grooves extending longitudinally along each said wire, each said groove undercutting the surface of one said wire;
   a thin film of substantially stoichiometric superconductive $Nb_3Ge$ sputter-deposited on a portion of each said groove and also on the surface between adjacent grooves, at least part of each undercutting portion of each groove being deposit-free; and
   said plurality of wires being consolidated into said composite structure by an enveloping metallic matrix of a normally conductive metal.

16. The superconductor of claim 15 wherein each said groove spirals along the length of the wire in which it is located thereby defining a helix.

* * * * *